(12) United States Patent
Yama (10) Patent No.: US 6,194,936 B1
(45) Date of Patent: Feb. 27, 2001

(54) PULSE GENERATOR PROVIDED WITH A DUTY-FACTOR LIMITING FUNCTION

(75) Inventor: Michiaki Yama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/234,484

(22) Filed: Jan. 21, 1999

(30) Foreign Application Priority Data

Jan. 22, 1998 (JP) .................................................. 10-010486

(51) Int. Cl.[7] .......................... H03K 3/017; H03K 12/00

(52) U.S. Cl. ....................... 327/175; 327/124; 327/131; 327/184; 327/291

(58) Field of Search ..................................... 327/104, 186, 327/124, 131, 137, 139, 140, 172–175, 178, 180, 309, 321, 291, 303, 304

(56) References Cited

U.S. PATENT DOCUMENTS

| 4,360,747 | * | 11/1982 | Ryan | 327/131 |
|---|---|---|---|---|
| 4,638,255 | * | 1/1987 | Penney | 327/184 |
| 5,315,260 | * | 5/1994 | Link et al. | 327/184 |
| 5,387,882 | * | 2/1995 | Schoofs | 327/131 |

* cited by examiner

Primary Examiner—Toan Tran
(74) Attorney, Agent, or Firm—Arent Fox Kintner Plotkin & Kahn, PLLC (57) ABSTRACT

In a pulse generator, a sawtooth-shaped wave generator circuit generates a sawtooth-shaped wave by charging and discharging a capacitor. The sawtooth-shaped wave is fed to a comparator that performs pulse-width modulation on it in accordance with the voltage it receives via a terminal and thereby produces pulses. The comparator has its output grounded through a transistor that is turned on with appropriate timing by the sawtooth-shaped wave generator circuit. Thus, the maximum duty factor of the output pulses is made equal to the duty factor of the sawtooth-shaped wave.

10 Claims, 5 Drawing Sheets

PULSE GENERATOR PROVIDED WITH A DUTY-FACTOR LIMITING FUNCTION

BACKGROUND OF THE INVENTION

1. Field of the Invention

The present invention relates to a pulse generator for generating pulses with which to control the switching operation of a DC/DC converter designed to step up a direct-current voltage.

1. Description of the Prior Art

A DC/DC converter designed to step up a direct-current (hereafter referred to as "DC") voltage typically has an inductance coil and a switch connected in series between a DC voltage input terminal and ground. The node between the inductance coil and the switch is connected to a rectifier circuit. The rectified output voltage is fed to an output terminal. The switch is typically realized by the use of a switching transistor, and the output voltage varies according to the ratio of the length of the period in which the transistor Tr is conducting (on) and the length of the period in which the transistor Tr is cut off (off). The transistor Tr is turned on or off in synchronism with pulses (duty pulses) that are generated by a pulse generator circuit. The pulse generator circuit generates duty pulses by comparing with a reference voltage a voltage having a sawtooth-shaped waveform generated by a sawtooth-shaped wave generator circuit.

Here, if the duty factor of the period in which the switching transistor Tr is kept on, e.g. the duty factor of the high-level period of the pulses, is higher than a predetermined value, the inductance coil reaches magnetic saturation. Therefore, in a pulse generator circuit, it is not allowed to set the duty factor above a certain limit. Moreover, in cases where the rectified output voltage is fed back so as to be related to the reference voltage fed to the comparator, if the pulse generator circuit is started with the output voltage at 0 (zero) V, unless a limit is imposed on the duty factor of the period in which the switching transistor is kept on, the switching transistor is kept on perpetually by the polarity that is fed back, with the result that no change ever occurs in the output voltage. This means that a pulse generator circuit must be provided with a function of limiting the duty factor (in the example given above, the duty factor of the high-level period of the pulses).

To achieve this, in a conventional pulse generator circuit, it is customary to feed a DC voltage to be used to limit the duty factor (hereafter such a voltage will be referred to as a "duty-factor limiting voltage") to the comparator thereof from the outside so that, when the stepped-up (output) voltage becomes too low, making the reference voltage higher than the duty-factor limiting voltage, the comparator will compare the voltage of the sawtooth-shaped wave with the duty-factor limiting voltage rather than with the reference voltage. This helps prevent the duty factor of the high-level period of the output pulses from becoming higher than a predetermined value.

Thus, a conventional pulse generator circuit as is used to control the output voltage of a DC/DC converter or the like on the basis of feedback requires a separate duty-factor limiting voltage to limit the duty factor of its output pulses. Since the DC level and the amplitude of a sawtooth-shaped wave respectively vary according to how the supply voltage is set and whether synchronization with a clock is required or not, to obtain the desired maximum duty factor, it is necessary to adjust the duty-factor limiting voltage in view of the specifications actually given in particular cases.

This inconveniently leads to a large variation of the maximum duty factor due to temperature variation and improper adjustment. Note that the variation in the maximum duty factor due to temperature variation results from temperature-dependent variation of the duty-factor limiting voltage, which is a DC voltage.

Moreover, a terminal for receiving the duty-factor limiting voltage needs to be provided separately, and the comparator requires a complicate circuit configuration to achieve comparison between the output voltage of an error amplifier and the voltage of the sawtooth-shaped wave. This inconveniently leads to a larger circuit area, and to a higher cost.

Note that synchronization with a clock means synchronizing the period of the switching operation of the DC/DC converter with an even number of times the period of the system clock used in a given appliance. This helps prevent the DC/DC converter from affecting adversely the signals generated within the appliance, suppress temperature-dependent instability of the operation of the DC/DC converter, and achieve other purposes.

Note that synchronization with a clock, when actually achieved, makes the amplitude of the sawtooth-shaped wave smaller. This means that, even if the duty-factor limiting voltage is kept constant, the maximum duty factor varies depending on the presence of synchronization with a clock (i.e. whether synchronization with a clock is being actually achieved or not). For example, in a pulse generator circuit of a certain type, starting synchronization with a clock while keeping the duty-factor limiting voltage at the same level as when the circuit is operating independently (i.e. when synchronization with a clock is not achieved) may make the maximum duty factor of the high level period unduly low.

Moreover, even with the same specifications, if the DC level and the amplitude of the sawtooth-shaped wave vary from appliance to appliance, to obtain the desired maximum duty factor, it is inevitable to adjust the duty-factor limiting voltage for each individual appliance. Therefore, no appliance-to-appliance variation is permitted in the DC level and the amplitude of the sawtooth-shaped wave, and thus it is necessary to use a high-precision voltage generator circuit or the like to generate the sawtooth-shaped wave. This inconveniently requires an even larger circuit area and an even higher cost.

Moreover, since a pulse generator circuit that is used to control the output voltage of a DC/DC converter on the basis of feedback suffers from problems as described above, the DC/DC converter as a whole suffers from instability of its output voltage, from an unduly large circuit area and an unduly high cost, and from the difficulty of the initial adjustments that need to be made when it is incorporated into an appliance.

SUMMARY OF THE INVENTION

An object of the present invention is, in a pulse generator provided with a function of limiting the duty factor of the output pulses, to minimize the variation of the maximum duty factor due to temperature variation and improper adjustment, and to reduce the circuit area and the cost thereof.

Another object of the present invention is, in a DC/DC converter, to further stabilize the output voltage thereof, to reduce the circuit area and the cost thereof, and to simplify the initial adjustments that need to be made when it is incorporated into an appliance.

To achieve the above objects, according to the present invention, a pulse generator provided with a function of limiting the duty factor of the output pulses thereof produces pulses by performing pulse-width modulation in accordance with a voltage it receives, and meanwhile the maximum duty factor of the output pulses is kept equal to the duty factor of the sawtooth-shaped wave that is used to produce the pulses.

For example, by keeping the output voltage constant irrespective of the input voltage while the voltage of the above-mentioned sawtooth-shaped wave is rising or falling, it is possible to keep the maximum duty factor of the output pulses equal to the duty factor of the sawtooth-shaped wave.

This circuit configuration eliminates the need to prepare a DC voltage to be used as a duty-factor limiting voltage, and makes it possible to set the maximum duty factor at a desired value irrespective of the DC level or the amplitude of the sawtooth-shaped wave.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
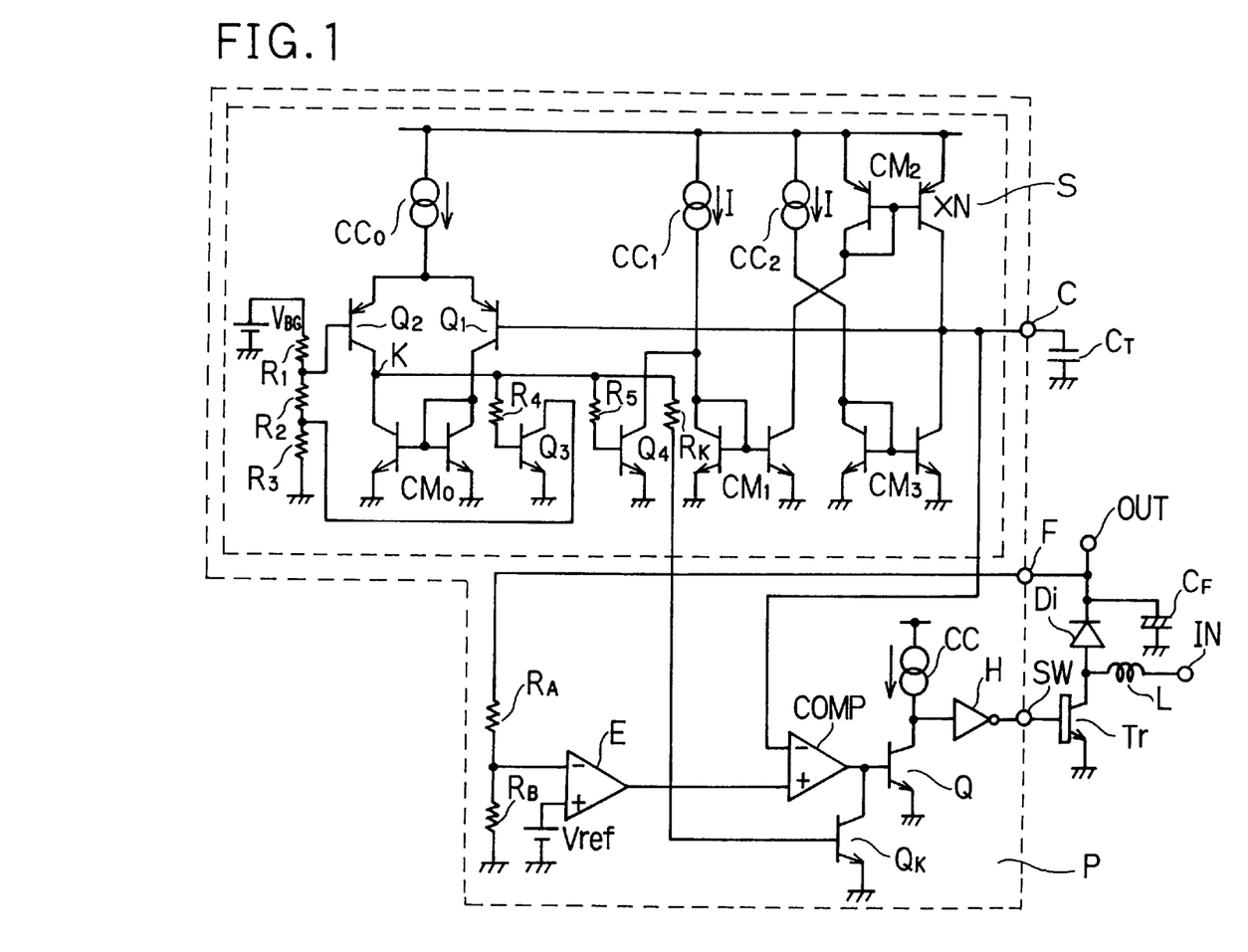
FIG. 1 is a diagram illustrating the circuit design of a DC/DC converter that controls its output voltage on the basis of feedback by the use of a pulse generator embodying the invention.

Hereinafter, embodiments of the present invention will be described with reference to the accompanying drawings. FIG. 1 shows the circuit design of a DC/DC converter that controls its output voltage on the basis of feedback by the use of a pulse generator embodying the invention.

In this figure, a switching transistor Tr is turned on and off. When the transistor Tr is turned from on to off, the inductance of a coil L tends to keep a current flowing through the coil L, thereby raising the collector potential of the transistor Tr. A DC voltage fed in via a terminal IN is stepped up by this property of the inductance. The resulting stepped-up voltage is rectified by a diode Di and a smoothing capacitor $C_F$, and is then fed out via a terminal OUT. The output voltage varies with the ratio of the length of the period in which the transistor Tr is kept on to the length of the period in which the transistor Tr is kept off. The turning on and off of the transistor Tr is achieved by the use of pulses (duty pulses) generated by a pulse generating circuit P. The pulse generating circuit P operates in the following manner.

The pulse generating circuit P receives the stepped-up voltage via a terminal F and divides it by means of resistors $R_A$ and $R_B$. The stepped-up voltage thus divided by means of the resistors $R_A$ and $R_B$ is, together with a reference voltage Vref, fed to an error amplifier E, which outputs a voltage that corresponds to the voltage difference between the stepped-up voltage and the reference voltage. Here, the higher the stepped-up voltage is relative to the reference voltage, the lower the output voltage of the error amplifier E; the lower the stepped-up voltage is relative to the reference voltage, the higher the output voltage of the error amplifier E. A comparator COMP compares the output voltage of the error amplifier E with the voltage of the sawtooth-shaped wave that a sawtooth-shaped wave generator circuit S generates by charging and discharging a capacitor $C_T$. The comparator COMP outputs a high level when the output voltage of the error amplifier E is higher than the voltage of the sawtooth-shaped wave, and outputs a low level when the output voltage of the error amplifier E is lower than the voltage of the sawtooth-shaped wave.

The output side of the comparator COMP is connected to the base of a transistor Q. The collector of the transistor Q is connected to the current-outlet side of a constant current circuit CC, and is also connected through an inverting amplifier H to a terminal SW. The output side of the comparator COMP is also connected through an npn-type transistor $Q_K$ to ground.

Thus, as long as the transistor $Q_K$ is kept off, when the comparator COMP outputs a high-level voltage, the transistor Q is turned on, and thus the inverting amplifier H outputs a high-level voltage at the terminal SW, causing the switching transistor Tr to be turned on. By contrast, when the comparator COMP outputs a low-level voltage, the transistor Q is turned off, and thus the inverting amplifier H outputs a low-level voltage at the terminal SW, causing the switching transistor Tr to be turned off.

In this way, the comparator COMP compares the output voltage of the error amplifier E with the voltage of the sawtooth-shaped wave so as to output, at the terminal SW, pulses produced by pulse-width modulation performed in accordance with the voltage difference between the stepped-up voltage and the reference voltage. Specifically, the higher the stepped-up voltage is relative to the reference voltage, the smaller the duty factor of the high-level period of the pulses appearing at the terminal SW; by contrast, the lower the stepped-up voltage is relative to the reference voltage, the greater the duty factor of the high-level period of the pulses appearing at the terminal SW. As a result, the duty factor with which the switching transistor Tr is turned on and off is controlled in accordance with the voltage difference between the stepped-up voltage and the reference voltage, and thus the voltage fed out via the terminal OUT is kept stably at the level of the reference voltage.

Note that, while the transistor $Q_K$ remains on, the transistor Q remains off irrespective of the result of the comparison by the comparator COMP, and thus the voltage fed out via the terminal SW is kept at a low level. Moreover, as will be described later, the transistor $Q_K$ is turned on with predetermined timing in response to a signal fed from the sawtooth-shaped wave generator circuit S, so that a limit is imposed on the duty factor of the high-level period of the pulses fed out via the terminal SW.

The sawtooth-shaped wave generator circuit S is configured as follows. Two pnp-type transistors $Q_1$ and $Q_2$ form a differential pair, with their emitters connected to the current-outlet side of a constant current circuit $CC_0$. The collectors of the transistors $Q_1$ and $Q_2$ are connected to the input and output sides, respectively, of a current-inflow-type current mirror $CM_0$ circuit composed of two npn-type transistors. The base of the transistor $Q_1$ is connected to a terminal C, and the base of the transistor $Q_2$ is connected to the node between resistors $R_1$ and $R_2$. These resistors $R_1$ and $R_2$ are, together with another resistor $R_3$, connected in series across a voltage $V_{BG}$, with $R_1$, $R_2$, and $R_3$ arranged in this order from the higher-potential side. The node between the resistors $R_2$ and $R_3$ is connected through an npn-type transistor $Q_3$ to ground.

The node K between the collector of the transistor $Q_2$ and the output side of the current mirror circuit $CM_0$ is connected simultaneously through a resistor $R_4$ to the base of the npn-type transistor $Q_3$, through a resistor $R_5$ to the base of another npn-type transistor $Q_4$, and through a resistor $R_K$ to the base of the transistor $Q_K$.

The current-outlet side of the constant current circuit $CC_1$ is connected to the input side of a current-inflow-type current mirror circuit $CM_1$ composed of two npn-type transistors, and is also connected through the transistor $Q_4$ to ground. The output side of the current mirror circuit $CM_1$ is connected to the input side of a current-inflow-type current mirror circuit $CM_2$ composed of two pnp-type transistors, and the output side of the current mirror circuit $CM_2$ is connected to the terminal C.

The current-outlet side of the constant current circuit $CC_2$ is connected to the input side of a current-inflow-type current mirror circuit $CM_3$ composed of two npn-type transistors. The output side of the current mirror circuit $CM_3$ is connected to the terminal C.

According to this circuit configuration, when electric power starts being supplied, the capacitor $C_T$ has no electric charge accumulated in it and the terminal C is at the ground potential, and thus the transistor $Q_1$ is turned on, and the transistor $Q_2$ is kept off. This causes the transistors $Q_3$ and $Q_4$ to remain off. Now, let the output current of the constant current circuits $CC_1$ and $CC_2$ be I, and let the current amplification factor of the current mirror circuit $CM_2$ be N. Then, a current $(N-1)\times I$ flows into the capacitor $C_T$, whereby the capacitor $C_T$ is charged. Thereafter, when the voltage across the capacitor $C_T$ exceeds $V_H = (R_2+R_3) V_{BG}/(R_1+R_2+R_3)$ (here it is assumed that the resistors $R_1$, $R_2$, and $R_3$ have resistances $R_1$, $R_2$, and $R_3$, respectively), then the transistor $Q_2$ is turned on, and this causes the transistors $Q_3$ and $Q_4$ to be turned on. As a result, the current mirror circuits $CM_1$ and $CM_2$ are turned off. Accordingly, a current I flows out of the capacitor $C_T$ through the current mirror circuit $CM_3$, whereby the capacitor $C_T$ is discharged. Thereafter, when the voltage across the capacitor $C_T$ becomes equal to $V_L = R_2 \cdot V_{BG}/(R_1+R_2)$, then the transistor $Q_2$ is turned off, and this causes the transistors $Q_3$ and $Q_4$ to be turned off. As a result, the charging of the capacitor $C_T$ by the current $(N-1)\times I$ is restarted.

Figure 2:
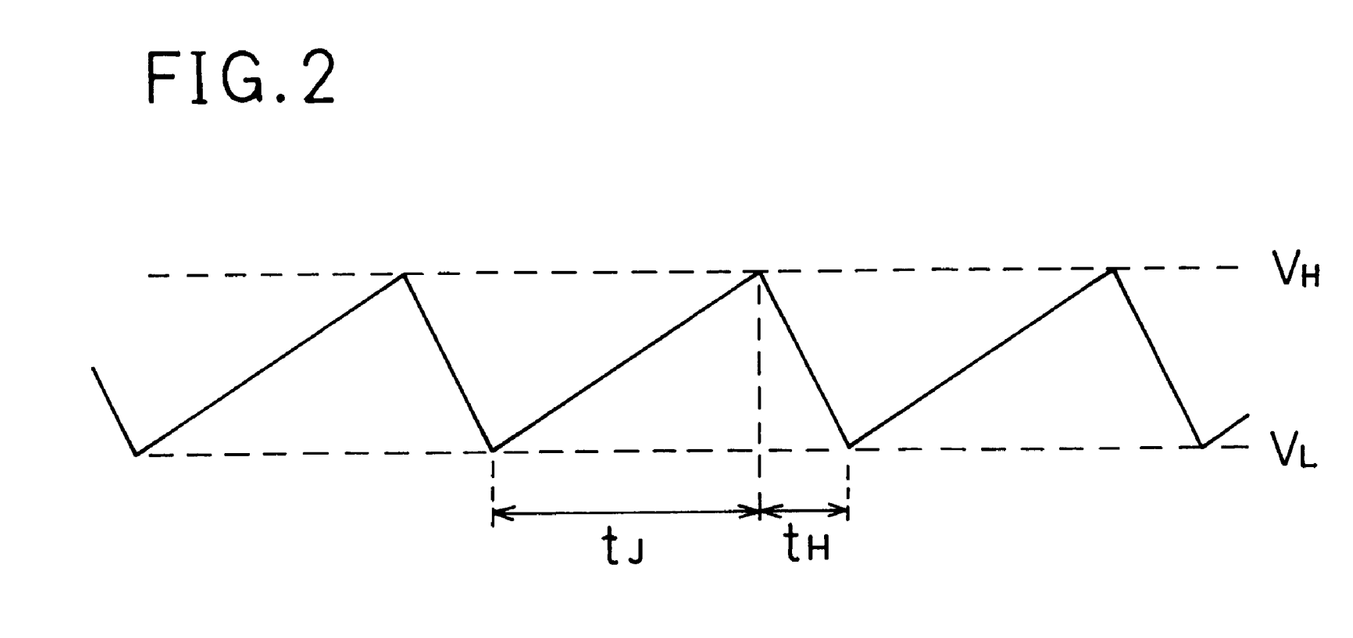
FIG. 2 is a diagram illustrating the waveform of the sawtooth-shaped wave generated by the sawtooth-shaped wave generator circuit and the capacitor.

Consequently, the voltage at the terminal $C_T$ exhibits a waveform as shown in FIG. 2, and in this way a sawtooth-shaped wave is generated that vacillates between the voltages $V_H$ and $V_L$. Here, the ratio of the time $t_j$ that the voltage of the sawtooth-shaped wave takes to increase from $V_L$ to $V_H$ to the time $t_H$ that it takes to decrease from $V_H$ to $V_L$ is $1/[(N-1)\cdot I]$: $1/I=1$: $(N-1)$, where N represents the current amplification factor of the current mirror circuit $CM_2$.

The transistor $Q_K$ is turned on and off with the same timing as the transistors $Q_3$ and $Q_4$. Accordingly, while the capacitor $C_T$ is being charged, i.e. while the voltage of the sawtooth-shaped wave is rising, the transistor $Q_K$ is kept off, and thus the transistor Q is turned on and off in accordance with the result of the comparison performed by the comparator COMP. By contrast, while the capacitor $C_T$ is being discharged, i.e. while the voltage of the sawtooth-shaped wave is falling, the transistor $Q_K$ is kept on, and thus the transistor Q is kept off throughout.

Figure 3:
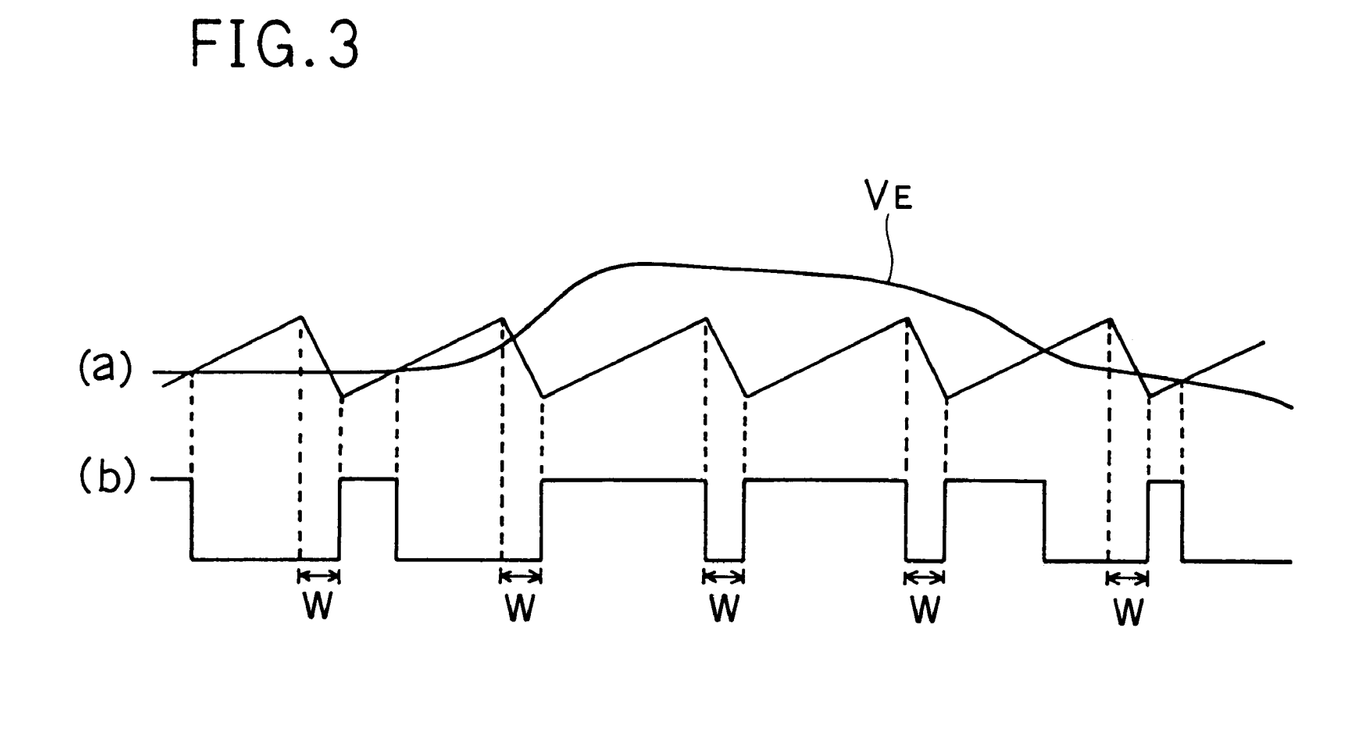
FIG. 3 is a waveform diagram illustrating the relationship between the input and output voltages in the pulse generator of the invention.

As a result, the maximum duty factor of the high-level period of the pulses fed out via the terminal SW is kept equal to the duty factor of the increasing-voltage period of the sawtooth-shaped wave, and in this way the maximum duty factor of the output pulses is made equal to the duty factor of the sawtooth-shaped wave (see FIG. 3). In FIG. 3, at (a) is shown the input voltage to the comparator COMP, and at (b) is shown the voltage at the terminal SW; $V_E$ indicates the voltage at the output of the error amplifier E; W indicates the period in which the transistor $Q_K$ is kept on and thus the transistor Q is kept off throughout, that is, the period in which the level at the terminal SW is forcibly kept at a low level so that a limit is imposed on the duty factor. Since the duty factor of the increasing-voltage period of the sawtooth-shaped wave is $1/[1+(N-1)]=1/N$, it is possible to set the maximum duty factor of the high-level period of the pulses fed out via the terminal SW, for example, at 80% by setting the current amplification factor N of the current mirror circuit $CM_2$ at $N=5/4$.

Figure 4:
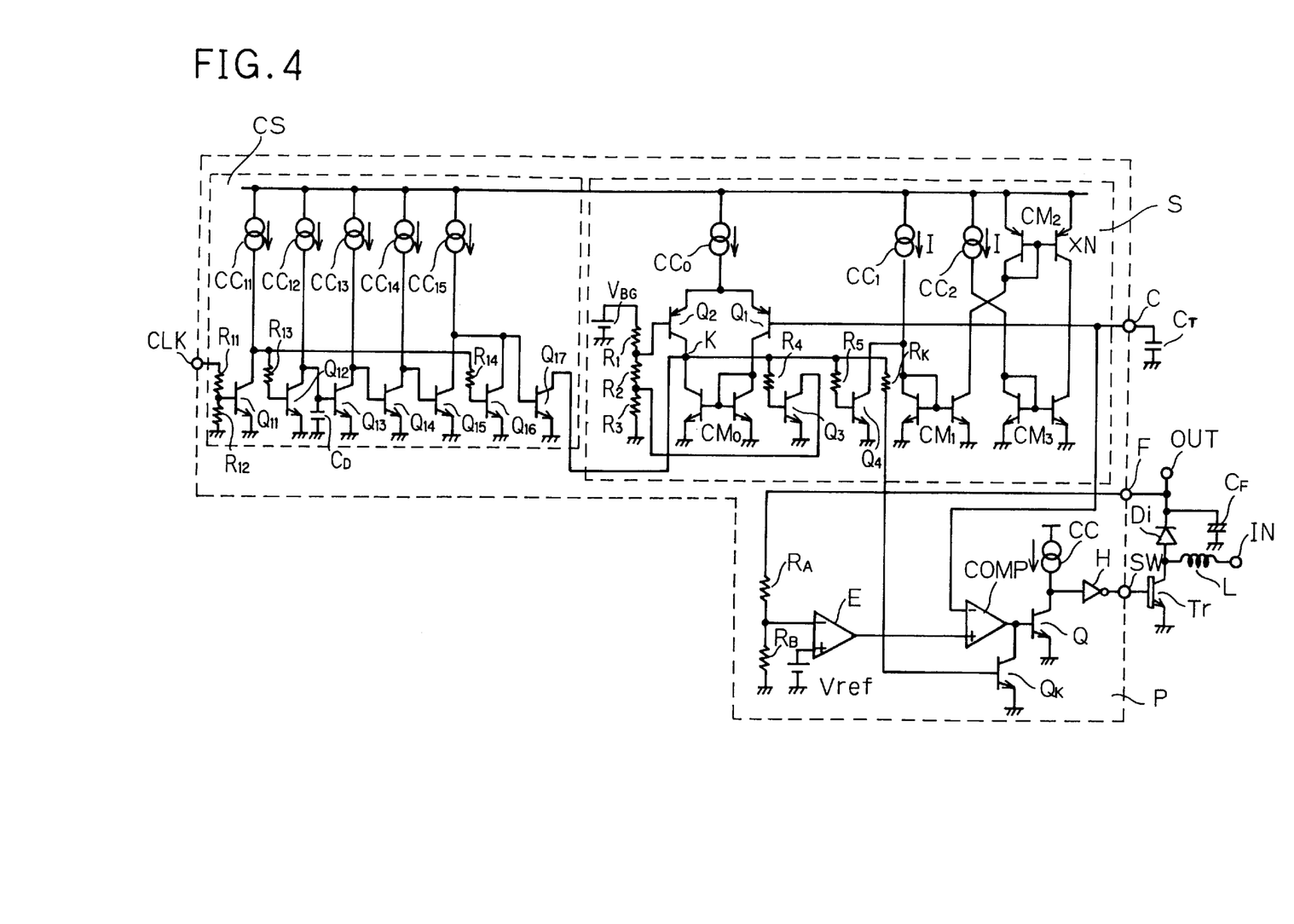
FIG. 4 is a diagram illustrating the circuit design of another DC/DC converter that controls its output voltage on the basis of feedback by the use of a pulse generator embodying the invention.

Next, a case where synchronization with a clock is achieved will be described. FIG. 4 shows the sawtooth-shaped wave generator circuit S of FIG. 1 as used in combination with a clock synchronization circuit CS for achieving synchronization with a clock. The clock synchronization circuit CS is configured as follows.

A transistor $Q_{11}$ has its base connected to the node between two resistors $R_{11}$ and $R_{12}$ connected in series between a terminal CLK and ground. Transistors $Q_{12}$ and $Q_{16}$ have their bases connected through resistors $R_{13}$ and $R_{14}$, respectively, to the collector of the transistor $Q_{11}$. A transistor $Q_{13}$ has its base connected to the collector of the transistor $Q_{12}$ and also connected through a capacitor $C_D$ to ground. Transistors $Q_{14}$ and $Q_{15}$ have their bases connected to the collectors of the transistors $Q_{13}$ and $Q_{14}$, respectively.

The transistors $Q_{11}$, $Q_{12}$, $Q_{13}$, and $Q_{14}$ have their collectors connected to the current-outlet side of constant current circuits $CC_{11}$, $CC_{12}$, $CC_{13}$, and $CC_{14}$, respectively. The collectors of the transistors $Q_{15}$ and $Q_{16}$ are both connected to the current-outlet side of a constant current circuit $CC_{15}$. The node between the constant current circuit $CC_{15}$ and the collectors of the transistors $Q_{15}$ and $Q_{16}$ is connected to the base of a transistor $Q_{17}$. The transistors $Q_{11}$, $Q_{12}$, $Q_{13}$, $Q_{14}$, $Q_{15}$, $Q_{16}$, and $Q_{17}$ have their emitters grounded. The collector of the transistor $Q_{17}$ is connected to a node K within the sawtooth-shaped wave generator circuit S.

According to this circuit configuration, at the rising edge of a clock fed in via the terminal CLK, a one-shot pulse is applied to the base of the transistor $Q_{17}$. Thus, at the rising edge of the clock fed in via the terminal CLK, the node K within the sawtooth-shaped wave generator circuit S is grounded momentarily.

Figure 5:
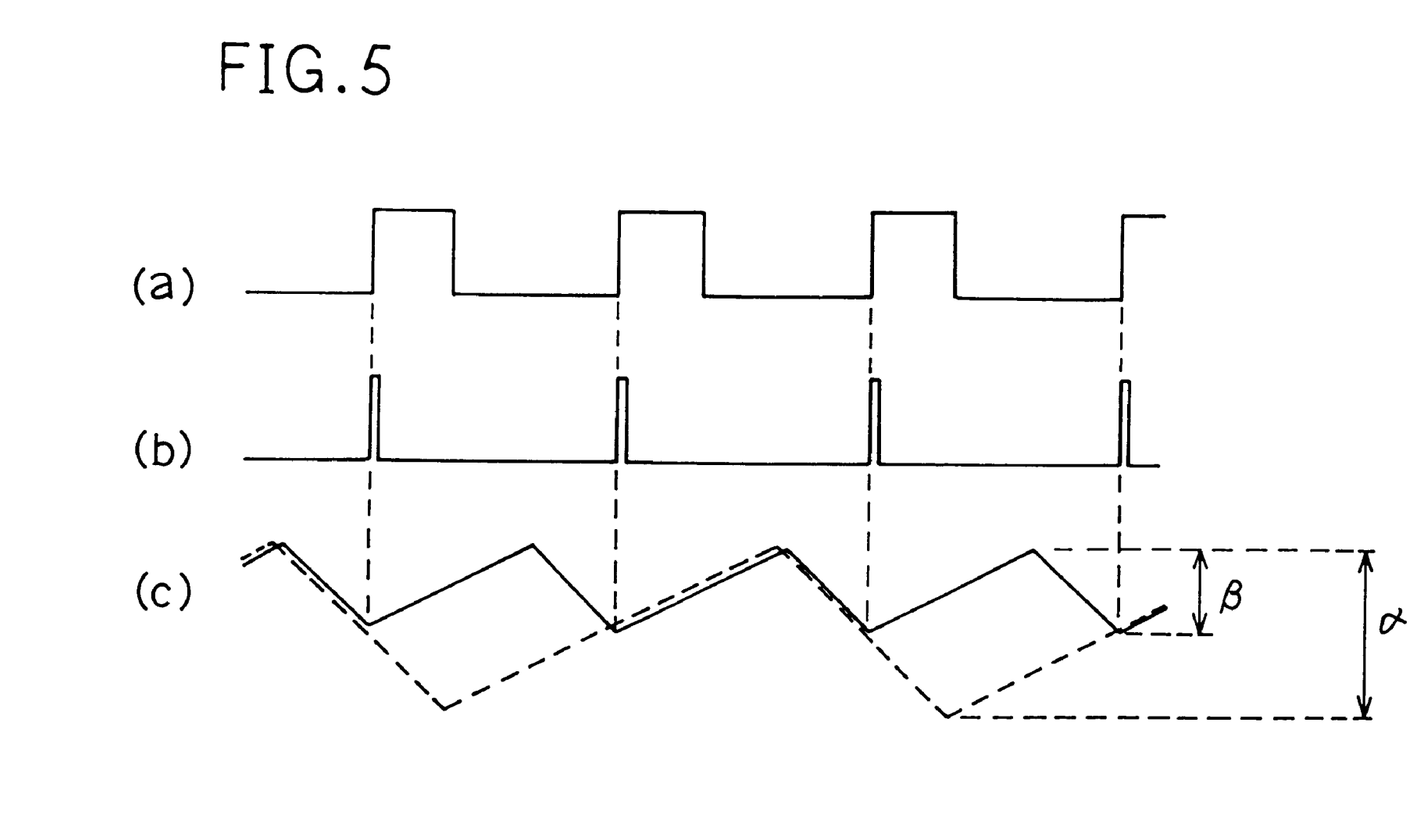
FIG. 5 is a waveform diagram illustrating how the sawtooth-shaped wave is generated in synchronism with the clock.

As a result, within the sawtooth-shaped wave generator circuit S, at the rising edge of the clock fed in via the terminal CLK, the transistors $Q_3$ and $Q_4$ are turned off momentarily. This has no effect at all as long as the capacitor $C_T$ is in the process of being charged, since in such a situation the transistors $Q_3$ and $Q_4$ are off from the beginning. However, if the same happens while the capacitor $C_T$ is in the process of being discharged, the capacitor $C_T$ starts being charged, since in such a situation the transistors $Q_3$ and $Q_4$ are on. In other words, in this case, the charging of the capacitor $C_T$ is forcibly started at the rising edge of the clock fed in via the terminal CLK even before the voltage across the capacitor $C_T$ decreases to $V_L$, and accordingly the amplitude of the obtained sawtooth-shaped wave becomes smaller (see FIG. 5). In FIG. 5, at (a) is shown the clock fed in via the terminal CLK, at (b) is shown the base voltage of the transistor $Q_7$, and at (c) is shown the voltage of the sawtooth-shaped wave appearing at the terminal C. At (c), the broken line indicates the sawtooth-shaped wave obtained when the sawtooth-shaped wave generator circuit S is operating independently, with a representing the amplitude thereof. At (c), the solid line indicates the sawtooth-shaped wave obtained when synchronization with the clock is achieved, with β representing the amplitude thereof.

Depending on the frequency of the clock fed in via the terminal CLK, the ratio of the charging period of the capacitor $C_T$ to the discharging period thereof may vary from one charge/discharge period to the next immediately after the start of synchronization with the clock (i.e. immediately after electric power starts being supplied). However, such variation gradually becomes negligibly small, until the duty factor of the sawtooth-shaped wave becomes sufficiently stable.

In this way, synchronization with a clock, when actually achieved, makes the amplitude of the sawtooth-shaped wave smaller. However, in the pulse generating circuit P of the embodiment under discussion, this does not affect in any way the maximum duty factor of the output pulses. This is because the maximum duty factor of the output pulses is kept equal to the duty factor of the sawtooth-shaped wave, and therefore, even if the amplitude of the sawtooth-shaped wave becomes smaller, its duty factor does not vary as long as the charge/discharge current of the capacitor $C_T$ is kept constant.

As described above, in the pulse generating circuit P of this embodiment, it is possible to limit the duty factor of the output pulses without the use of a DC voltage as is required as a duty-factor limiting voltage in a conventional circuit. Moreover, since the maximum duty factor of the output pulses is kept equal to the duty factor of the sawtooth-shaped wave, it can be set by appropriately setting the current with which the sawtooth-shaped wave generator circuit S charges and discharges the capacitor $C_T$. Thus, as long as there is no variation in the charge/discharge current of the capacitor $C_T$, the maximum duty factor of the output pulses can be kept constant irrespective of the DC level and the amplitude of the sawtooth-shaped wave.

Thus, it is possible to set the maximum duty factor of the output pulses at a desired value without making any additional adjustment depending on how the supply voltage is set, which affects the DC level of the sawtooth-shaped wave, and whether synchronization with a clock is required or not, which affects the amplitude of the sawtooth-shaped wave. Note that, in reality, the sawtooth-shaped wave generator circuit S is built as an IC (integrated circuit). This ensures very small variation in the charge/discharge current of the capacitor $C_T$, and thus allows the maximum duty factor of the output pulses to be set with high precision.

Accordingly, a pulse generator according to the present invention offers the following advantages. It is possible to minimize the variation of the maximum duty factor due to temperature variation and improper adjustment. It is possible to eliminate the need to provide a terminal for receiving a duty-factor limiting voltage, and thus it is possible to simplify the circuit configuration of the comparator used to compare the output voltage of the error amplifier E and the voltage of the sawtooth-shaped wave, and thereby reduce the circuit area and the cost of the pulse generator. Moreover, it is no longer necessary to use a high-precision voltage generator circuit to generate the sawtooth-shaped voltage, and thus it is possible to further reduce the circuit area and the cost of the pulse generator.

On the other hand, in a DC/DC converter according to the present invention, the pulse generator that is used to control its output voltage on the basis of feedback has the above-noted advantages. Thus, it is possible to obtain a more stable output voltage from the DC/DC converter, reduce the circuit area and the cost of the DC/DC converter, and simplify the initial adjustments that need to be made when the DC/DC converter is incorporated into an appliance.

What is claimed is:

1. A pulse generator comprising:
   a sawtooth-shaped wave generating circuit that generates a sawtooth-shaped wave voltage;
   a pulse generating circuit that compares the sawtooth-shaped wave voltage with a first predetermined voltage by means of a first comparator and that generates pulses with such a duty factor that duration of each pulse coincides with a period during which the sawtooth-shaped wave voltage exceeds the first predetermined voltage; and
   a limiting circuit that sets an upper limit on the duty factor by forcibly keeping an output of the first comparator at a fixed voltage either during a period in which the sawtooth-shaped wave voltage is rising or during a period in which the sawtooth-shaped wave voltage is decaying.

2. A pulse generator as claimed in claim 1,
   wherein the sawtooth-shaped wave generating circuit has a circuit for charging and discharging a capacitor and compares a voltage across this capacitor with a second predetermined voltage by means of a second comparator so that the sawtooth-shaped wave voltage is generated by charging the capacitor when the voltage across it is lower than the second predetermined voltage and discharging the capacitor when the voltage across it is higher than the second predetermined voltage, the discharging being continued until the voltage across the capacitor becomes equal to a third predetermined voltage which is lower than the second predetermined voltage, and
   the limiting circuit is driven by an output of the second comparator.

3. A pulse generator comprising:
   an inductance coil that receives a direct-current voltage at one end;
   a switching transistor that is connected between another end of the inductance coil and a fixed voltage;
   a rectifying circuit that rectifies a high voltage that appears at the other end of the inductance coil when the switching transistor is turned from on to off;
   an amplifier that compares an output voltage of the rectifying circuit with a reference voltage and generates a first predetermined voltage;
   a sawtooth-shaped wave generating circuit for generating a sawtooth-shaped wave voltage;
   a first comparator that generates duty pulses by comparing the sawtooth-shaped wave voltage with the first predetermined voltage and that supplies those duty pules to a control electrode of the switching transistor; and
   a limiting circuit that sets an upper limit on the duty factor by forcibly keeping an output of the first comparator at a fixed voltage either during a period in which the sawtooth-shaped wave voltage is rising or during a period in which the sawtooth-shaped wave voltage is decaying.

4. A pulse generator as claimed in claim 3,
   wherein the sawtooth-shaped wave generating circuit has a circuit for charging and discharging a capacitor and compares a voltage across this capacitor with a second predetermined voltage by means of a second comparator so that the sawtooth-shaped wave voltage is generated by charging the capacitor when the voltage across it is lower than the second predetermined voltage and discharging the capacitor when the voltage across it is higher than the second predetermined voltage, the discharging being continued until the voltage across the capacitor becomes equal to a third predetermined voltage, which is lower than the second predetermined voltage, and the limiting circuit driven by an output of the second comparator.

5. A pulse generator as claimed in claim 4, wherein the second comparator comprises:

a first transistor and a second transistor that together constitute a differential pair;

a conductor that connects the voltage across the capacitor to a base of the first transistor; and a circuit that applies the second and third predetermined voltage to a base of the second transistor.

6. A pulse generator as claimed in claim 4, wherein a clock signal is fed to an output node of the second comparator so that the sawtooth-shaped wave generating circuit and the limiting circuit operate in synchronism with the clock signal.

7. A pulse generator as claimed in claim 4, wherein the circuit that charges or discharges the capacitor includes a circuit for supplying a constant current as a charging/discharging current to the capacitor.

8. A pulse generator as claimed in claim 6, wherein a one-shot pulse made from the edge of the clock signal is added to the output node of the second comparator.

9. A pulse generator as claimed in claim 2, wherein the limiting circuit includes a transistor that is controlled by the output of the second comparator to connect the output of the first comparator to the fixed voltage, the transistor having one end connected to an output terminal of the first comparator, having another end connected to a fixed voltage point and having a control electrode connected to the output of the second comparator.

10. A pulse generator as claimed in claim 4, wherein the limiting circuit includes a transistor that is controlled by the output of the second comparator to connect the output of the first comparator to the fixed voltage, the transistor having one end connected to an output terminal of the first comparator, having another end connected to a fixed voltage point, and having a control electrode connected to the output of the second comparator.

* * * * *